United States Patent
Wang

(10) Patent No.: US 12,471,247 B2
(45) Date of Patent: Nov. 11, 2025

(54) FLUID DEVICE

(71) Applicant: FIVEGRAND INTERNATIONAL CO., LTD., New Taipei (TW)

(72) Inventor: Ting-Jui Wang, New Taipei (TW)

(73) Assignee: FIVEGRAND INTERNATIONAL CO., LTD., New Taipei (TW)

( * ) Notice: Subject to any disclaimer, the term of this patent is extended or adjusted under 35 U.S.C. 154(b) by 465 days.

(21) Appl. No.: 17/938,963

(22) Filed: Sep. 7, 2022

(65) Prior Publication Data

US 2023/0078859 A1    Mar. 16, 2023

(30) Foreign Application Priority Data

Sep. 13, 2021    (TW) .................................. 110134016

(51) Int. Cl.
*H05K 7/20* (2006.01)

(52) U.S. Cl.
CPC ..... *H05K 7/20272* (2013.01); *H05K 7/20263* (2013.01)

(58) Field of Classification Search
CPC .. H05K 7/20272; H05K 7/20263; G06F 1/20; G06F 1/203; H01L 23/473
See application file for complete search history.

(56) References Cited

U.S. PATENT DOCUMENTS

| | | | | |
|---|---|---|---|---|
| 3,696,492 A * | 10/1972 | Baillard | ............... | H05K 7/1415 29/758 |
| 5,297,929 A * | 3/1994 | Horng | ................ | H05K 7/20172 415/121.3 |
| 5,478,221 A * | 12/1995 | Loya | ..................... | H01L 23/467 417/313 |
| 5,785,116 A * | 7/1998 | Wagner | ................. | H01L 23/467 257/722 |
| 6,880,239 B1 * | 4/2005 | Jennings | .............. | H01R 43/205 29/729 |
| 7,055,581 B1 * | 6/2006 | Roy | ...................... | H01L 23/427 174/15.2 |
| 2004/0114327 A1 * | 6/2004 | Sri-Jayantha | ......... | H01L 23/467 257/E23.099 |
| 2008/0227379 A1 * | 9/2008 | Hung | .................... | F04D 29/601 411/378 |
| 2015/0342074 A1 * | 11/2015 | Sunaga | ................... | H01L 24/35 361/728 |
| 2017/0034953 A1 * | 2/2017 | Chen | ................... | F04D 25/0613 |
| 2017/0244211 A1 * | 8/2017 | Lee | ....................... | H05K 7/1452 |
| 2020/0383245 A1 * | 12/2020 | Davidson | ........... | H05K 7/20836 |

FOREIGN PATENT DOCUMENTS

| | | |
|---|---|---|
| CN | 106704335 A | 5/2017 |
| TW | M399592 U | 3/2011 |

\* cited by examiner

*Primary Examiner* — Jayprakash N Gandhi
*Assistant Examiner* — Jeffrey Francis Stoll

(57) ABSTRACT

A fluid device includes an assembly potion and a block portion. The assembly portion is for assembling with an object. The block portion is provided at the assembly portion, and is for blocking or guiding a fluid. Thus, the fluid device of the present disclosure is enabled to provide effects of a secure arrangement as well as effectively guiding or disturbing a fluid to dissipate heat.

15 Claims, 17 Drawing Sheets

FLUID DEVICE

CROSS-REFERENCE TO RELATED APPLICATION

This non-provisional application claims priority under 35 U.S.C. § 119(a) on Patent Application No(s). 110134016 filed in Taiwan, R.O.C. on Sep. 13, 2021, the entire contents of which are hereby incorporated by reference.

BACKGROUND OF THE INVENTION

1. Field of the Invention

The present disclosure provides a fluid device, and in particular to a fluid device providing a secure arrangement and capable of effectively guiding or disturbing a fluid to dissipate heat.

2. Description of the Related Art

Heat is usually produced during the operation of a conventional electronic apparatus. Thus, a gas or fluid cooled apparatus needs to be provided to meet heat dissipation requirements.

However, limited by an internal space of the electronic apparatus, gas or liquid may not be effectively guided to enter the electronic apparatus to dissipate heat, resulting in degraded heat dissipation efficiency.

BRIEF SUMMARY OF THE INVENTION

In view of the prior art above, the applicant provides a fluid device, in the aim of achieving objects of providing a secure arrangement and being capable of effectively guiding or disturbing a fluid to dissipate heat.

To achieve the above and other objects, the present disclosure provides a fluid device including an assembly portion and a block portion. The assembly portion is for assembling with an object. The block portion is provided at the assembly portion, and is for blocking or guiding a fluid.

The present disclosure further provides a fluid device including an assembly portion, a block portion and a shaft portion. The assembly portion is for assembling with an object. The block portion is provided at the assembly portion, and is for blocking or guiding a fluid. The shaft portion is combined with the block portion.

In the fluid device above, one end or both ends of the assembly portion or the shaft portion are provided with a stop portion, which stops against the block portion or the assembly portion.

In the fluid device above, the assembly portion or the shaft portion is provided with a stop portion, the block portion is provided with a corresponding stop portion, and the stop portion correspondingly stops against the corresponding stop portion.

In the fluid device above, the shaft portion is provided with a stop portion, the assembly portion is provided with a corresponding stop portion, and the stop portion correspondingly stops against the corresponding stop portion.

In the fluid device above, the assembly portion is provided with a stop portion, the object is provided with a corresponding stop portion, and the stop portion correspondingly stops against the corresponding stop portion.

In the fluid device above, the block portion is provided with a stop portion, the assembly portion is provided with a corresponding stop portion, and the stop portion correspondingly stops against the corresponding stop portion.

Regarding the fluid device above, the fluid device is picked up by a tool, moved to a predetermined height of an assembly position of the object by the tool, and released or set free from the tool, such that the assembly portion is placed at the assembly position of the object.

Regarding the fluid device above, the fluid device is picked up by a tool, moved to an assembly position of the object by the tool, pressed down by the tool, and released or set free from the tool, such that the assembly portion is placed at the assembly position of the object.

Regarding the fluid device above, the fluid device is picked up by a tool, moved to an assembly position of the object by the tool, elastically pressed down by the tool, and released or set free from the tool, such that the assembly portion is placed at the assembly position of the object.

Regarding the fluid device above, the fluid device is picked up by a tool, moved to an assembly position of the object by the tool, and released or set free from the tool, such that the assembly portion is placed at the assembly position of the object.

Regarding the fluid device above, the fluid device is picked up by a tool and moved to an assembly position of the object by the tool, the tool senses that the device comes into contact with the object, and the fluid device is released or set free from the tool, such that the assembly portion is placed at the assembly position of the object.

Regarding the above fluid device, once the fluid device is picked up by a tool, a comparison device is provided to compare the fluid device and an assembly position or an assembly distance of the object, and the fluid device is moved by the tool according to comparison information of the comparison device.

In the fluid device above, the tool is a vacuum suction device, a fixture, a magnetic device, a clamp or a mechanical arm.

In the fluid device above, the assembly portion has a weldable surface, a predetermined tin layer is present between the object and the assembly portion, and the weldable surface and the tin layer are heated, cooled, and solidified so as to couple the object and the assembly portion.

In the fluid device above, the object is a printed circuit board having a copper layer, wherein the copper layer is located below a tin layer, and the two are heated and adhered for use in combination for welding.

In the fluid device above, the assembly portion has a fastening portion, which is fastened with a corresponding fastening portion so as to clamp the object.

In the fluid device above, the assembly portion has a material storage space, and the object is pressed to cause a material of the object to flow into or enter the material storage space.

In the fluid device above, the assembly portion has an expansion connection structure adapted to be pressed so as to be expansion connected to the object.

In the fluid device above, the block portion has a fitting portion, and one or more of the block portions are fittingly connected with each other by using the fitting portion so as to increase an area of the block portion.

In the fluid device above, the object has a fluid, and the block portion performs blocking or rotates to change a direction of the fluid.

In the fluid device above, the block portion is a sheet-like body, a sector body, or a leaf-shaped body, and the block portion is movable or rotatable, or the block portion is in a fixed position.

In the fluid device above, the block portion and the shaft portion are movable or rotatable, or the block portion and the shaft portion are fixed.

In the fluid device above, the object has an entering portion, which allows a fluid to enter the object so that the fluid device comes into contact with the fluid.

In the fluid device above, the object is provided with an integrated circuit (IC), a central processing unit (CPU), a graphics processing unit (GPU) or a heating element, and the block portion guides a fluid according to the position of the IC, CPU, GPU or heating element to dissipate heat.

In the fluid device above, the object is a printed circuit board (PCB), a water-cooled apparatus, an air-cooled apparatus, a rack, a casing, a plate, a cage, a cupboard, a sliding track or a cabinet.

In the fluid device above, the block portion is a sector body or a leaf-shaped body, and is for driving the fluid to move, rotate or turn.

In the fluid device above, the block portion is a sheet-like body, a sector body, or a leaf-shaped body, is adapted to be installed at a partial position of the object, and is for guiding a fluid at the installation position or near the installation position to dissipate heat.

In the fluid device above, the block portion is a sheet-like body, a sector body, or a leaf-shaped body, is adapted to be installed at a position through which a fluid passes, and is for guiding a fluid at the installation position or near the installation position to dissipate heat.

In the fluid device above, the fluid is a gas or a liquid.

In the fluid device above, solder that is heated, cooled and solidified is present between the stop portion and the corresponding stop portion.

The fluid device above further includes an electrically conductive portion, which is for conducting an electric current to drive the block portion to move by electric power.

In the fluid device above, the electrically conductive portion has a positive pole and a negative pole, the object is a PCB and has a corresponding electrically conductive portion, and the positive pole and the negative pole are connected to the corresponding electrically conductive portion.

In the fluid device above, a cover is provided. The cover covers, shields or protects the block portion.

The fluid device above further includes an electrically conductive portion, which is for conducting an electric current to drive the block portion to move by electric power, wherein the block portion is in communication with a positive pole and a negative pole of the electrically conductive portion.

In the fluid device above, the electrically conductive portion has a positive pole and a negative pole, the object has a corresponding electrically conductive portion, and the positive pole and the negative pole are connected to the corresponding electrically conductive portion.

The fluid device above further includes a heat transfer module, which is connected to the block portion of a heat generator and is for transferring a heat source of the heat generator to the block portion to dissipate heat.

In the fluid device above, the heat transfer module includes a heat conductor or an intermediate heat conductor. The heat conductor is provided at the heat generator, the intermediate heat conductor is connected to the block portion or the heat conductor, or the heat conductor is for guiding the heat source of the heat generator to the intermediate heat conductor, or the intermediate heat generator is for guiding the heat source to the block portion to dissipate heat.

In the fluid device above, the fluid device, the assembly portion or a heat transfer module is welded or bonded to the object or a heat generator, so as to assemble the fluid device, the assembly portion or the heat transfer module at the object or the heat generator.

In the fluid device above, welding and heating causes the solder to produce a descending, sinking or downward force or pulling force when the solder is cooled from a liquid state to a solid state, or bonding produces a descending, sinking or downward force or pulling force, so that the fluid device, the assembly portion or the heat transfer module is adhered, attached or becomes close to the object or the heat generator.

In the fluid device above, the heat transfer module or a heat conductor of the heat transfer module has a channel portion. The channel portion allows a fluid to pass through to dissipate heat, or allows a liquid fluid or a gaseous fluid to pass through to dissipate heat.

In the fluid device above, the object is a printed circuit board (PCB), a water-cooled apparatus, an air-cooled apparatus, a rack, a casing, a plate, a cage, a cupboard, a sliding track or a cabinet; a heat generator is an IC, a CPU, a GPU or a heating element; or the fluid device further includes a cover which covers, shields or protects the block portion.

Thus, the fluid device of the present disclosure provides effects of a secure arrangement as well as effectively guiding or disturbing a fluid to dissipate heat.

DETAILED DESCRIPTION OF THE INVENTION

To facilitate understanding of the object, characteristics and effects of this present disclosure, embodiments together with the attached drawings for the detailed description of the present disclosure are provided.

Figure 1:
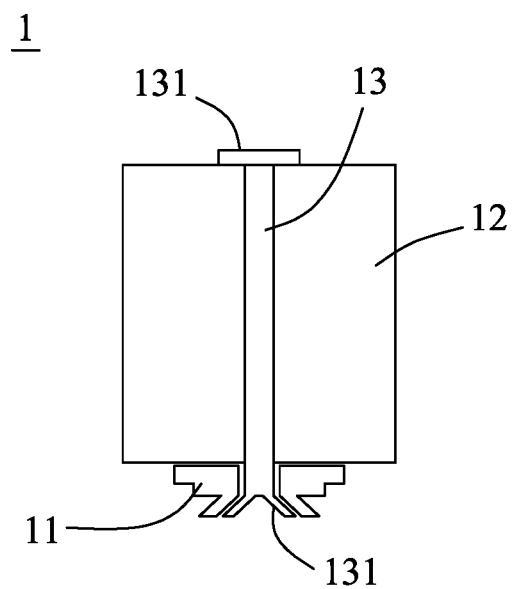
FIG. 1 is a side schematic diagram of a fluid device according to a first embodiment of the present disclosure.
Figure 2:
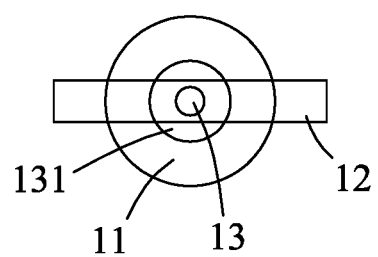
FIG. 2 is a top schematic diagram of a fluid device according to the first embodiment of the present disclosure.

Refer to FIG. 1 and FIG. 2 showing a fluid device of the present disclosure. The fluid device 1 includes an assembly portion 11, a block portion 12 and a shaft portion 13.

The assembly portion 11 is for assembling with an object (not shown).

The block portion 12 is for blocking or guiding a fluid, which is a gas or a liquid.

The shaft portion 13 is assembled with the block portion 12, or is assembled with the assembly portion 11 and the block portion 12.

To put to use, alternatively, only the assembly portion 11 and the block portion 12 (not shown) are optionally provided in response to actual application requirements.

During use, the fluid device 1 may be assembled with the object by using the assembly portion 11, providing the fluid device 1 with an effect of a secure arrangement at the object by using the assembly portion 11. Moreover, the block portion 12 is disposed in a fixed form or a mobile form by using the shaft 13, enabling an air-cooled apparatus on the object to generate a wind flow (or a liquid-cooled apparatus to generate a liquid flow), so as to guide the fluid to the block portion 12 for the block portion 12 to provide guidance in a blocking manner or guide in a rotating manner and change the direction of the fluid. Thus, the fluid can be guided to the position at which a heat source is generated, or to the position needing heat dissipation, so as to dissipate heat by using the fluid, thereby enabling the block portion 12 to achieve an effect of effectively guiding or disturbing the fluid to dissipate heat.

In one embodiment of the present disclosure, one end or both ends of the assembly portion 11 or the shaft portion 13 are provided with a stop portion 131, which stops against the block portion 12 of the assembly portion 11. In this embodiment, each of both ends of the shaft portion 13 is provided with a stop portion 131, and the stop portions 131 respectively stop against the block portion 12 and the assembly portion 11, thereby enabling the block portion 12 and the assembly portion 11 to be stably assembled at the shaft portion 13.

In one embodiment of the present disclosure, the block portion 12 and the shaft portion 13 are movable or rotatable such that the block portion 12 is in a mobile arrangement, or the block portion 12 and the shaft portion 13 are fixed relative to each other such that the block portion 12 is in a fixed arrangement.

In one embodiment of the present disclosure, the object may be a printed circuit board (PCB), a water-cooled apparatus, an air-cooled apparatus, a rack, a casing, a plate, a cage, a cupboard, a sliding track or a cabinet, thereby enabling the present disclosure to better meet actual application requirements.

Figure 3:
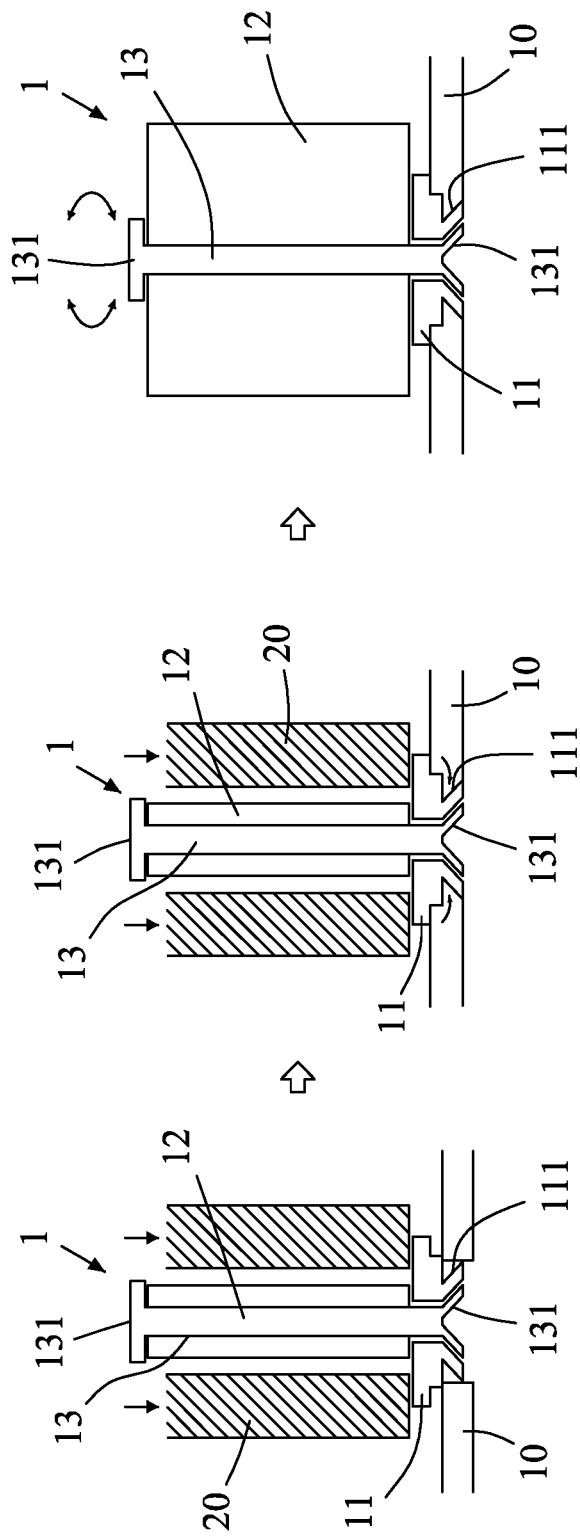
FIG. 3 is a first schematic diagram of a state of assembly of a fluid device of the present disclosure.
Figure 4:
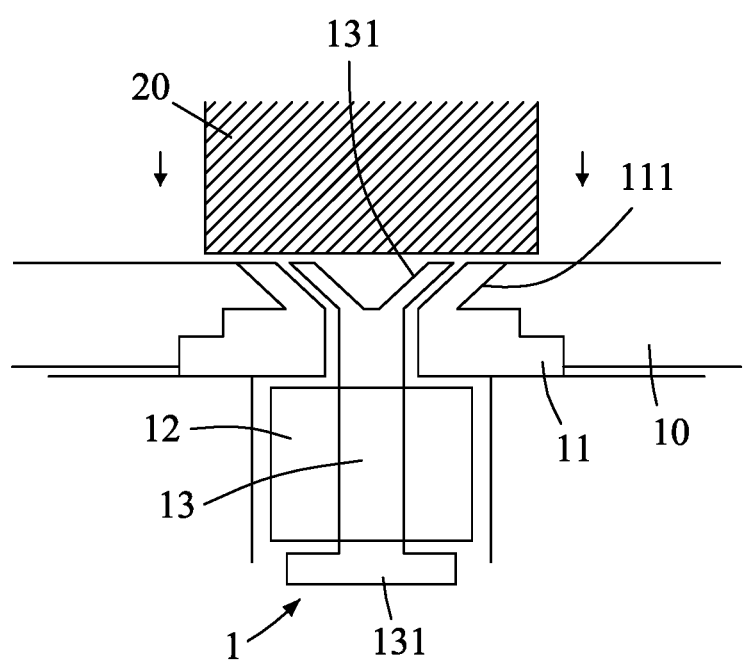
FIG. 4 is a second schematic diagram of a state of assembly of a fluid device of the present disclosure.

As shown in FIG. 3 and FIG. 4, in one embodiment of the present disclosure, a difference from the embodiment above is that, the assembly portion 11 has a material storage space 111, and the object 10 is pressed to cause a material of the object 10 that is pressed to flow into or enter the material storage space 111. Thus, the assembly portion 11 may be stamped by a mold 20, such that the mold 20 presses the assembly portion 11 to cause the material of the object 10 to flow into or enter the material storage space 111 (as shown in FIG. 3), enabling the fluid device 1 to be securely combined with the object 10 by using the assembly portion 11. Alternatively, the object 10 may also be stamped by a mold 20, such that the mold presses the object 10 to cause the material of the object 10 to flow into or enter the material storage space 111 (as shown in FIG. 4), similarly enabling the fluid device 1 to be securely combined with the object 10 by using the assembly portion 11.

Figure 5:
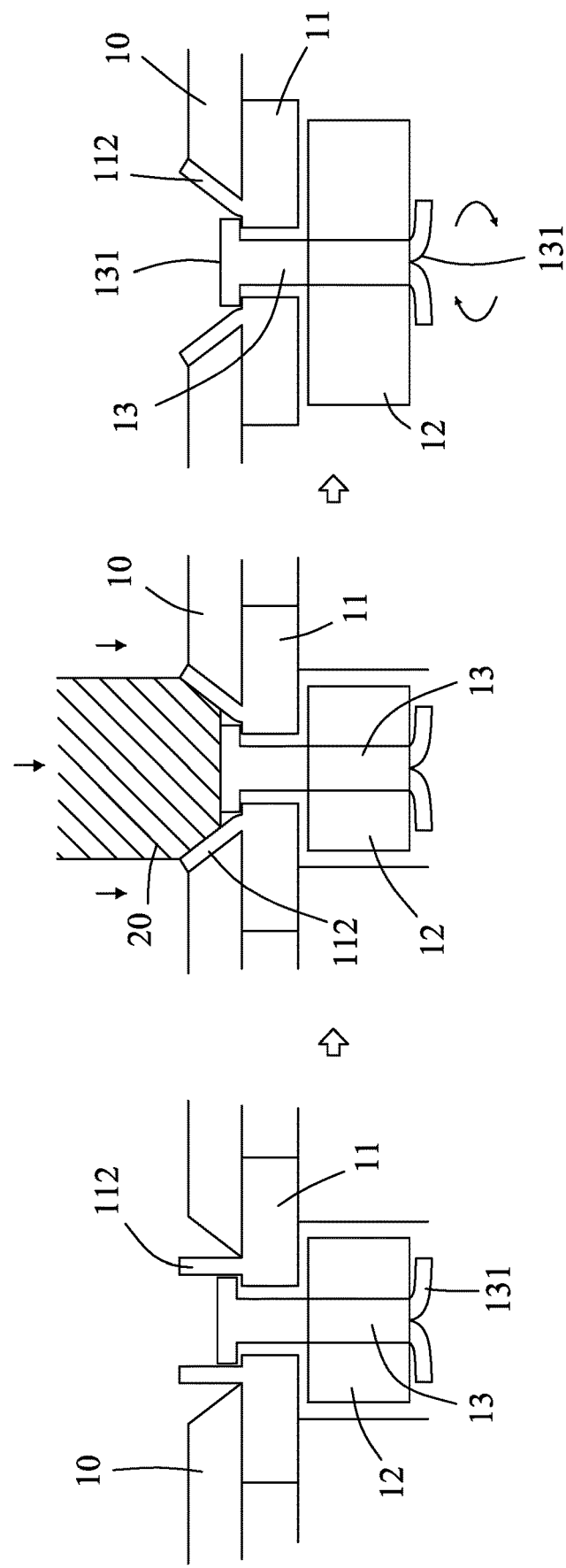
FIG. 5 is a third schematic diagram of a state of assembly of a fluid device of the present disclosure.

Referring to FIG. 5, in one embodiment of the present disclosure, a difference from the embodiments above is that, the assembly portion 11 has an expansion connection structure 112, which is adapted to be pressed so as to be expansion connected to the assembly portion 11 after being pressed. Thus, a force may be applied by a mold 20 to the expansion connection structure 112 of the assembly portion 11 to deform the expansion connection structure 112 that is then expansion connected to the object 10 after being pressed, enabling the fluid device 1 to be securely combined with the object 10 by using the assembly portion 11.

Figure 6:
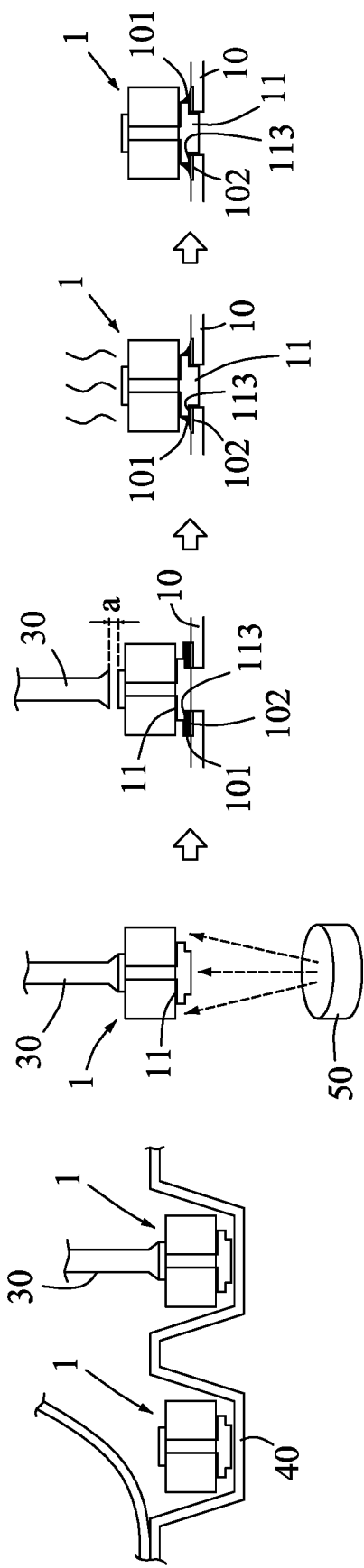
FIG. 6 is a fourth schematic diagram of a state of assembly of a fluid device of the present disclosure.

Referring to FIG. 6, in one embodiment of the present disclosure, a difference from the embodiments above is that, the fluid device 1 may be picked up from a carrier 40 by a tool 30, moved to a predetermined height a of an assembly position of the object 10 by the tool 30, and released or set free from the tool 30, such that the assembly portion 11 is placed at the assembly position of the object 10.

In one embodiment of the present disclosure, the fluid device 1 may also be moved by the tool 30 to an assembly position of the object 10, and is released or set free from the tool 30, such that the assembly portion 11 is placed at the assembly position of the object 10.

In one embodiment of the present disclosure, once the fluid device 1 is picked up by the tool 30, a comparison device 50 is provided to compare the fluid device 1 and the assembly position or an assembly distance of the object 10, and the fluid device 1 is moved by the tool 30 according to comparison information of the comparison device 50, thereby enabling the present disclosure to better meet actual assembly requirements.

In one embodiment of the present disclosure, the tool 30 is a vacuum suction device, a fixture, a magnetic device, a clamp or a mechanical arm, thereby enabling the present disclosure to better meet actual application requirements.

In one embodiment of the present disclosure, the assembly portion 11 has a weldable surface 113, a predetermined tin layer 101 is present between the object 10 and the assembly portion 11, and the weldable surface 113 and the tin layer 101 are heated, cooled, and solidified so as to couple the object 10 and the assembly portion 11, thereby enabling the fluid device 1 to be securely combined with the object 10 by using the assembly portion 11.

In one embodiment of the present disclosure, the object 10 is a printed circuit board having a copper layer 102, wherein the copper layer 102 is located below the tin layer 101, and the two are heated and adhered for use in combination with the weldable surface 113 for welding.

Figure 7:
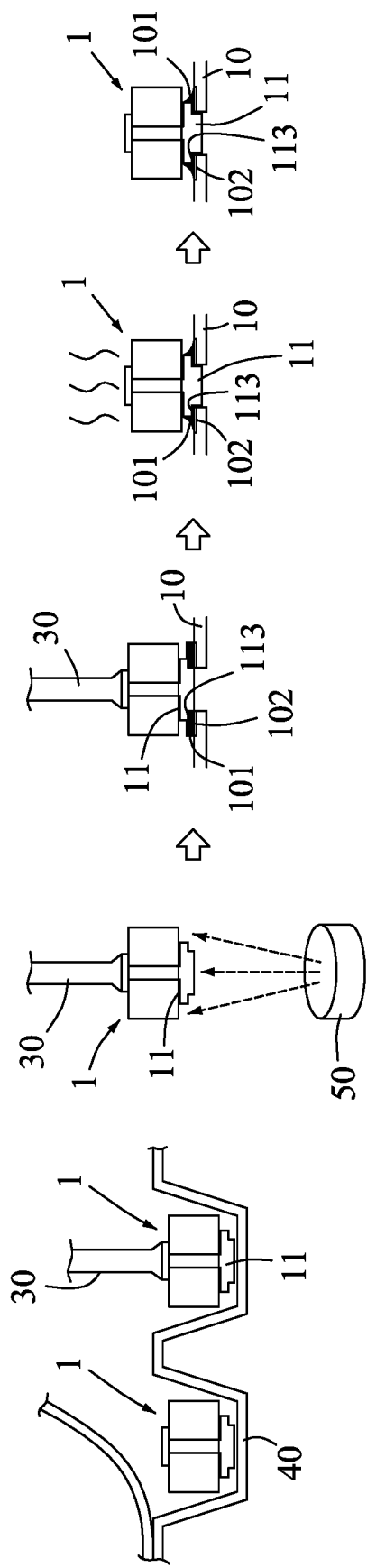
FIG. 7 is a fifth schematic diagram of a state of assembly of a fluid device of the present disclosure.

Referring to FIG. 7, in one embodiment of the present disclosure, a difference from the above embodiments is that, the fluid device 1 may be picked up by the tool 30, moved to an assembly position of the object 10 by the tool 30 according to the comparison information of the comparison device 50, pressed down by the tool 30, and released or set free from the tool 30, such that the assembly portion 11 is placed at the assembly position of the object 10. Moreover, the weldable surface 113 and the tin layer 101 are heated, cooled and solidified to couple the object 10 and the assembly portion 11, so that the fluid device 1 is securely coupled with the object 10 by using the assembly portion 11, thereby enabling the present disclosure to better meet actual assembly requirements.

In one embodiment of the present disclosure, when the fluid device 1 is moved by the tool 30 to the assembly position of the object 10, the tool 30 may sense that the device comes into contact with the object 10, and the fluid device 1 is then released or set free from the tool 30, such that the assembly portion 11 is placed at the assembly position of the object 10.

Figure 8:
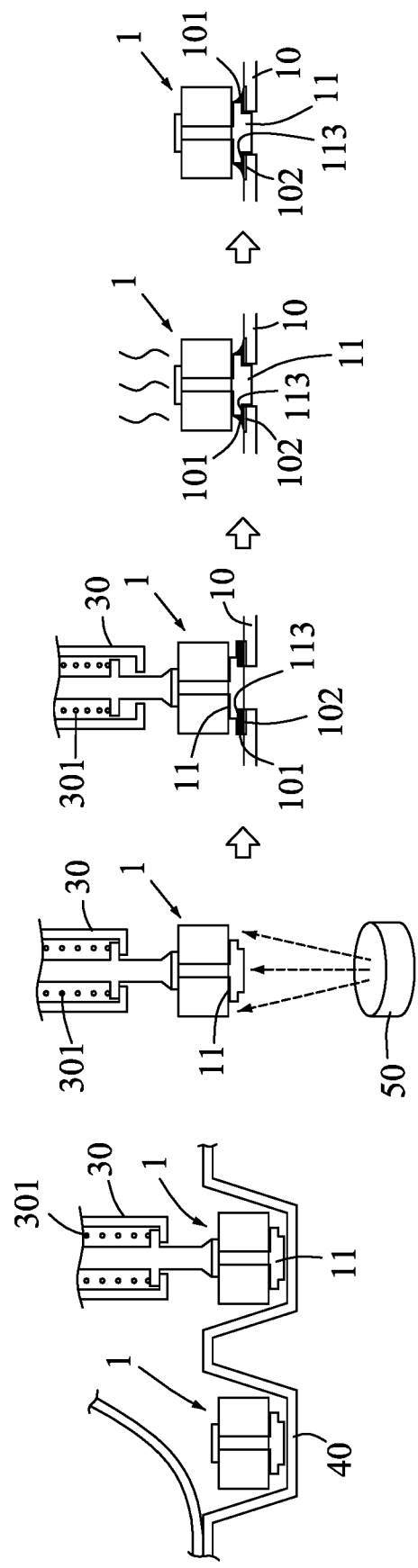
FIG. 8 is a sixth schematic diagram of a state of assembly of a fluid device of the present disclosure.

Referring to FIG. 8, in one embodiment of the present disclosure, a difference from the above embodiments is that, the fluid device 1 may be picked up by the tool 30, moved to an assembly position of the object 10 by the tool 30 according to the comparison information of the comparison device 50, elastically pressed down by the tool 30 with coordination of an elastic element 301, and released or set free from the tool 30, such that the assembly portion 11 is placed at the assembly position of the object 10. Moreover, the weldable surface 113 and the tin layer 101 are heated, cooled and solidified to couple the object 10 and the assembly portion 11, so that the fluid device 1 is securely coupled with the object 10 by using the assembly portion 11, thereby enabling the present disclosure to better meet actual assembly requirements.

Figure 9:
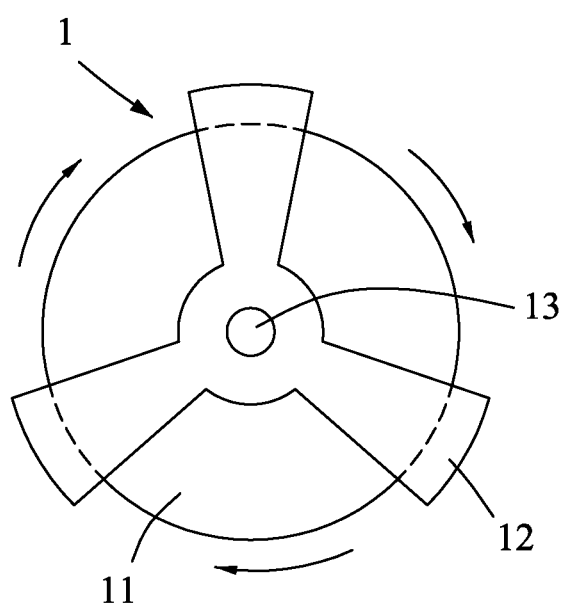
FIG. 9 is a schematic diagram of a state of use of a fluid device according to a second embodiment of the present disclosure.

Referring to FIG. 9, in one embodiment of the present disclosure, a difference from the above embodiments is that, the block portion 12 may be a sheet-like body, a sector body, or a leaf-shaped body, and the block portion 12 is formed in a movable or rotatable form, so as to use the block portion 12 for blocking or rotating to change the direction of a fluid. Thus, the fluid can be guided to the position at which a heat source is generated, or to the position needing heat dissipation, so as to dissipate heat by using the fluid, enabling the block portion 12 to achieve an effect of effectively guiding or disturbing the fluid to dissipate heat.

Figure 10:
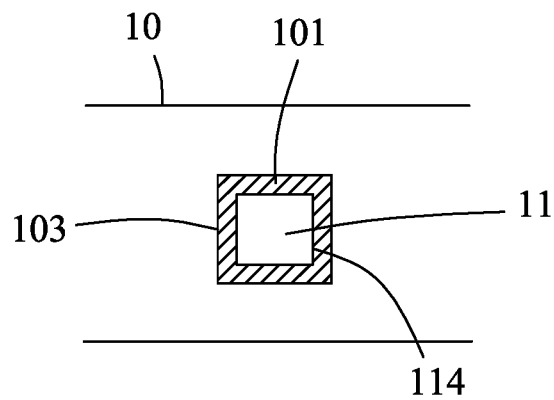
FIG. 10 is a schematic diagram of a state of use of a fluid device according to a third embodiment of the present disclosure.

Referring to FIG. 10, in one embodiment of the present disclosure, a difference from the above embodiments is that, the assembly portion 11 is provided with a stop portion 114, and the object 10 is provided with a corresponding stop portion 103. The stop portion 114 of the assembly portion 11 correspondingly stops against the corresponding stop portion 103 of the object 10, or solder that is heated, cooled and solidified is present between the stop portion 114 and the corresponding stop portion 103, so that the fluid device 1 is securely combined with the object 10 by using the assembly portion 11, thereby enabling the present disclosure to better meet actual assembly requirements.

Figure 11:
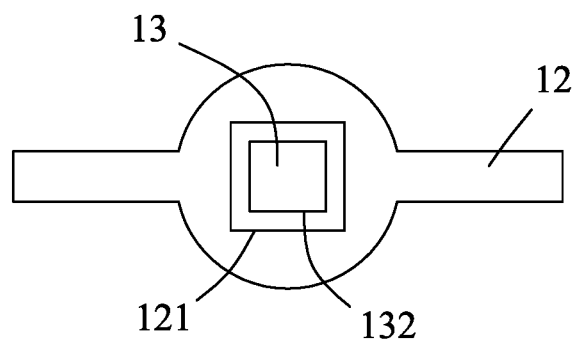
FIG. 11 is a schematic diagram of a state of use of a fluid device according to a fourth embodiment of the present disclosure.

Referring to FIG. 11, in one embodiment of the present disclosure, a difference from the above embodiments is that, the shaft portion 13 is provided with a stop portion 132, and the block portion 12 is provided with a corresponding stop portion 121. The stop portion 132 of the shaft portion 13 stops against the corresponding stop portion 121 of the block portion 12 to fixedly combine the block portion 12 at the shaft portion 13, thereby enabling the present disclosure to better meet actual assembly requirements.

Figure 12:
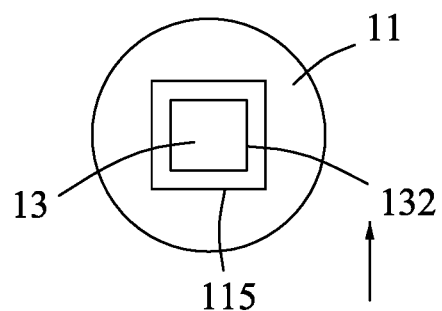
FIG. 12 is a schematic diagram of a state of use of a fluid device according to a fifth embodiment of the present disclosure.

Referring to FIG. 12, in one embodiment of the present disclosure, a difference from the above embodiments is that, the shaft portion 13 is provided with a stop portion 132, and the assembly portion 11 is provided with a corresponding stop portion 115. The stop portion 132 of the shaft portion 13 stops against the corresponding stop portion 115 of the assembly portion 11 to securely combine the assembly portion 11 with the shaft portion 13, thereby enabling the present disclosure to better meet actual assembly requirements.

Alternatively, the block portion 12 may be provided with a stop portion, and the assembly portion 11 may be provided with a corresponding stop portion. The stop portion stops against the corresponding stop portion (not shown) to securely combine the assembly portion 11 with the block portion 12, thereby enabling the present disclosure to better meet actual assembly requirements.

Figure 13:
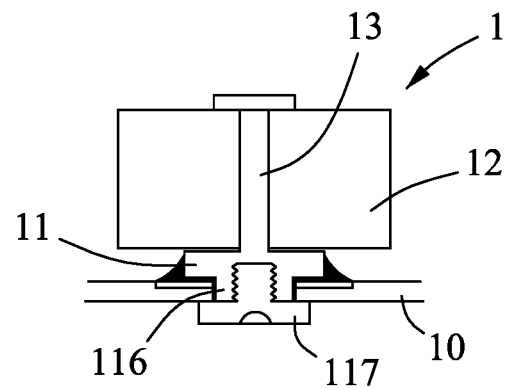
FIG. 13 is a schematic diagram of a state of use of a fluid device according to a sixth embodiment of the present disclosure.

Referring to FIG. 13, in one embodiment of the present disclosure, a difference from the above embodiments is that, the assembly portion 11 has a fastening portion 116. The fastening portion 116 is fastened with a corresponding fastening portion 117 to clamp the object 10, so that the fluid device 1 can be securely combined with the object 10 by using the fastening portion 116 and the corresponding fastening portion 117, thereby enabling the present disclosure to better meet actual assembly requirements.

Figure 14:
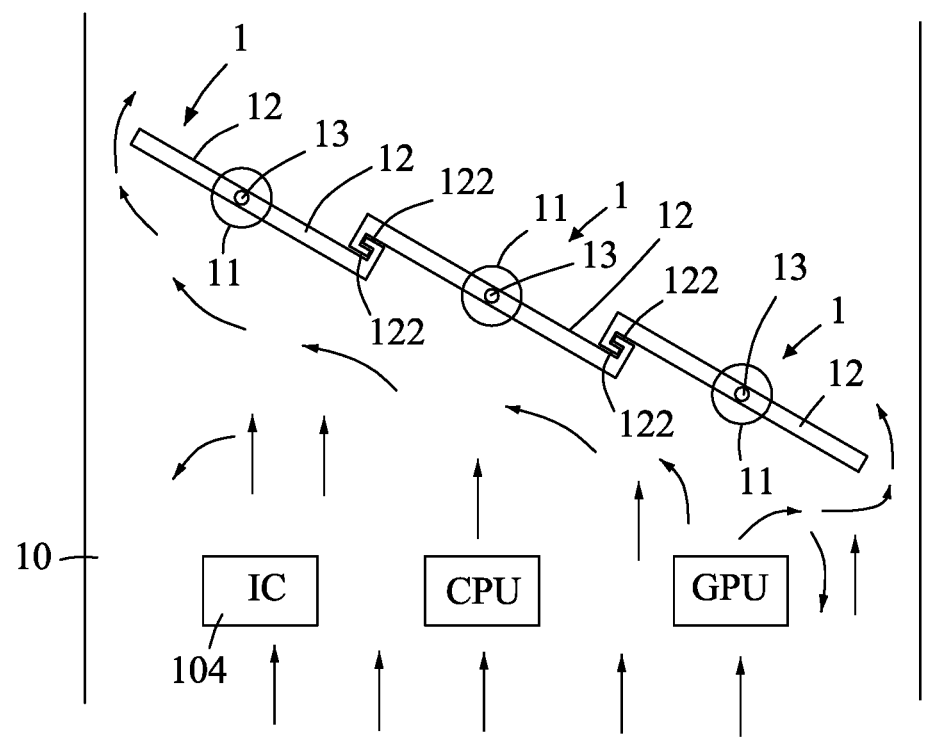
FIG. 14 is a schematic diagram of a state of use of a fluid device according to a seventh embodiment of the present disclosure.

Referring to FIG. 14, in one embodiment of the present disclosure, a difference from the above embodiments is that, the block portion 12 has a fitting portion 122, and one or more of the block portions 12 are fittingly connected with each other by using the fitting portion 122 so as to increase an area of the block portion 12. Moreover, the object 10 has a fluid, and the block portion 12 can perform blocking or rotate to change the direction of the fluid, thereby enabling the block portion 12 to achieve an effect of effectively guiding or disturbing the fluid to dissipate heat.

The object 10 is provided with an integrated circuit (IC), a central processing unit (CPU), a graphics processing unit (GPU) or a heating element 104, and the block portion 12 guides a fluid according to the position of the IC, CPU, GPU or heating element 104 to dissipate heat.

Figure 15:
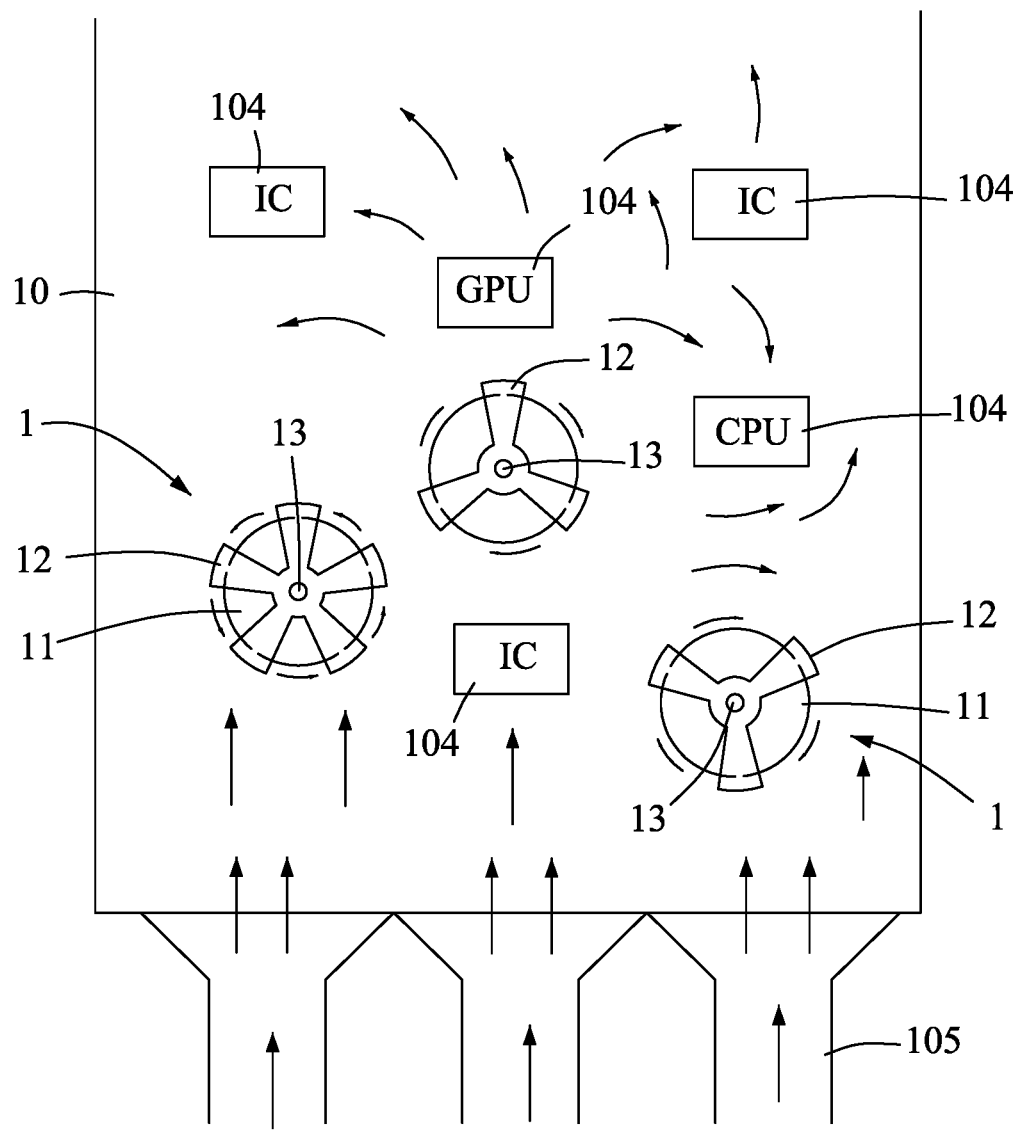
FIG. 15 is a schematic diagram of a state of use of a fluid device according to an eighth embodiment of the present disclosure.

Referring to FIG. 15, in one embodiment of the present disclosure, a difference from the above embodiments is that, the block portion 12 has an entering portion 105, which allows a fluid to enter the object 10 so that the fluid device 1 comes into contact with the fluid. Moreover, the block portion 12 may be a sector body, a leaf-shaped body, or a sheet-body, and is for driving the fluid to move, rotate or turn, for the block portion 12 to change in a blocking manner or a rotating manner the direction of the fluid, thereby enabling the block portion 12 to achieve an effect of effectively guiding or disturbing the fluid to dissipate heat.

In one embodiment of the present disclosure, the fluid device 1 is adapted to be installed at a partial position (for example, the position through which a fluid flow) of the object 10, and the block portion 12 guides the fluid at the position where the fluid device 1 is installed or near the installation position, thereby guiding the fluid to the position of the heating element 104 to dissipate heat of the heating element 104.

Figure 16:
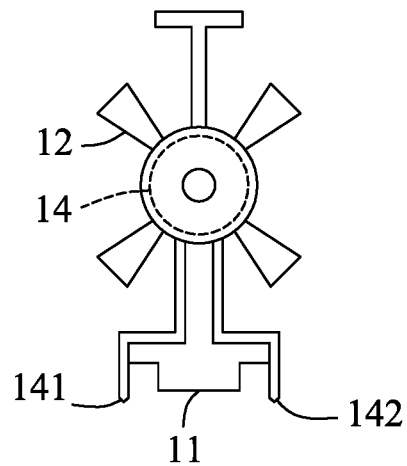
FIG. 16 is a side schematic diagram of a fluid device according to a ninth embodiment of the present disclosure.
Figure 17:
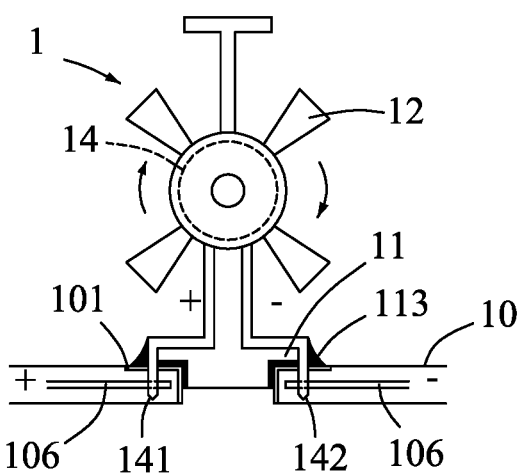
FIG. 17 is a first schematic diagram of a state of use of a fluid device according to the ninth embodiment of the present disclosure.
Figure 18:
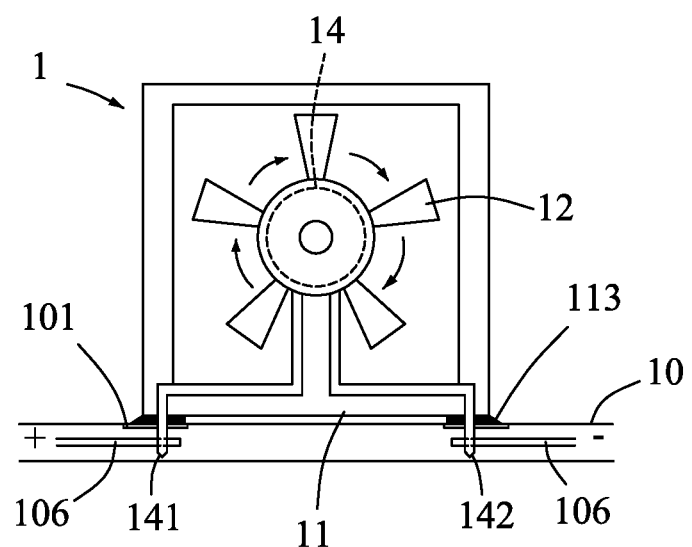
FIG. 18 is a second schematic diagram of a state of use of a fluid device according to the ninth embodiment of the present disclosure.

Referring to FIG. 16 to FIG. 18, in one embodiment of the present disclosure, a difference from the above embodiments is that, an electrically conductive portion 14 is further included for conducting an electrical current to drive the block portion 12 to operate by electrical power. In this embodiment, the electrically conductive portion 14 may be provided at the assembly portion 11, and the block portion 12 may be a leaf and be provided at the electrically conductive portion 14. The electrically conductive portion 14 has a positive pole 141 and a negative pole 142, the object 10 may be a printed circuit board and has a corresponding electrically conductive portion 106, and the positive pole 141 and the negative pole 142 are connected to the corresponding electrically conductive portion 106. Thus, when the object 10 operates in coordination with an electronic apparatus, with the coordination of the positive pole 141 and the negative pole 142 connected to the electrically conductive portion 106, electrical power needed for operating the electrically conductive portion 14 is supplied.

During use, the fluid device 1 may be combined with the object 10 by using the assembly portion 11, and the weldable surface 113 and the tin layer 101 are heated, cooled and solidified to couple the object 10 and the assembly portion 11, so that the fluid device 1 is securely combined with the object 10 by using the assembly portion 11. Moreover, the block portion 12 is driven by the electrically conductive portion 14 to rotate (or move), such that the electrically conductive portion 14 cooperates with the blocking portion 12 to generate a wind flow. Thus, the fluid can be guided to the position at which a heat source is generated, or to the position needing heat dissipation, so as to dissipate heat by using the fluid, thereby enabling the block portion 12 to achieve an effect of effectively guiding or disturbing the fluid to dissipate heat.

In one embodiment of the present disclosure, the fluid device 1 further includes a cover 15. The cover 15 may cover, shield or protect the block portion 12, so that the fluid is guided by the cover 15 to the position at which the heat source is generated or to the position needing heat dissipation when the block portion 12 generates a wind flow.

Figure 19:
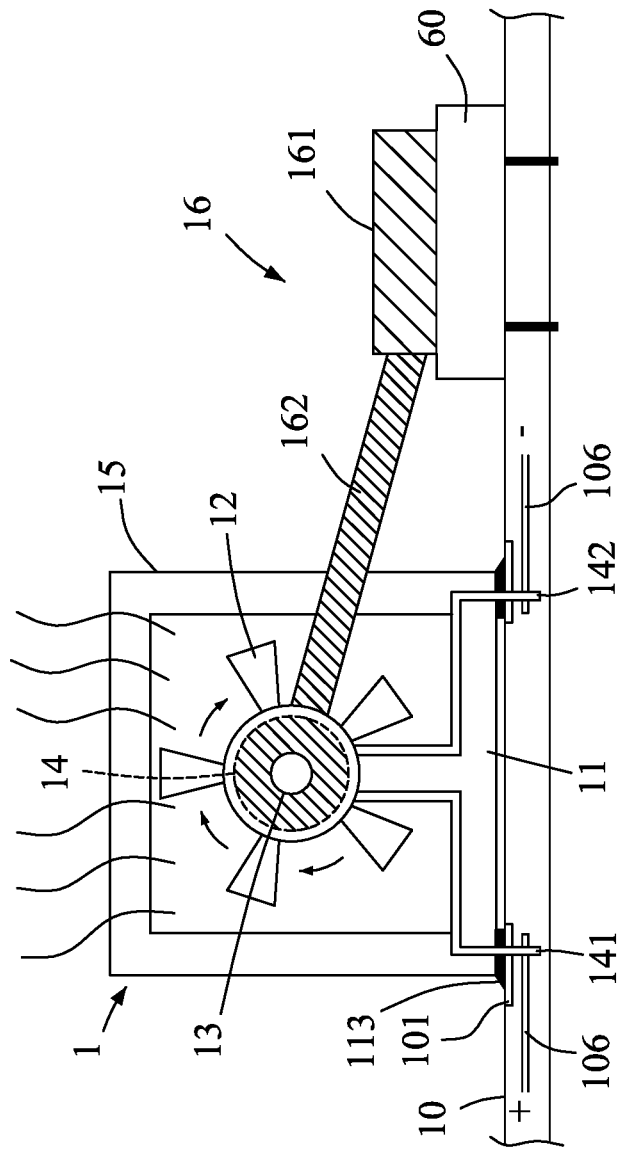
FIG. 19 is a schematic diagram of a state of use of a fluid device according to a tenth embodiment of the present disclosure.

Refer to FIG. 19 showing a fluid device of the present disclosure. The fluid device 1 includes an assembly portion 11, a block portion 12, a shaft portion 13 and a heat transfer module 16.

The assembly portion 11 is for assembling with an object 10.

The block portion 12 is for guiding a fluid, which is a gas or a liquid.

The shaft portion 13 is assembled with the assembly portion 11 and the block portion 12.

The heat transfer module 16 is connected to the block portion 12 and a heat generator 60, and is for transferring a heat source of the heat generator 60 to the block portion 12 to dissipate heat.

During use, the fluid device 1 may be combined with the object 10 by using the assembly portion 11, and the heat generator 60 may be disposed at the object 10, so that the fluid device 1 is provided with an effect of a secure arrangement at the object 10 by using the assembly portion 11, and the heat source of the heat generator 60 is transferred to the block portion 12 by using the heat transfer module 16. Because the block portion 12 is configured to be in a movable arrangement by the shaft portion 13, when the heat transfer module 16 transfers the heat source of the heat generator 60 to the block portion 12, the block portion 12 rotates and hence generates guidance or disturbance of the fluid so as to dissipate heat by using the fluid, thereby enabling the block portion 12 to achieve an effect of effectively guiding or disturbing the fluid to dissipate heat.

In one embodiment of the present disclosure, the assembly portion 11 of the fluid device 1 and the object 10 may be directly combined, or the fluid device 1 may be welded and combined to the tin layer 101 (or the copper layer 102) of the object 10 by using the weldable surface 113 of the assembly portion 11.

In one embodiment of the present disclosure, the object 10 may be a printed circuit board (PCB), a water-cooled apparatus, an air-cooled apparatus, a rack, a casing, a plate, a cage, a cupboard, a sliding track or a cabinet, thereby enabling the present disclosure to better meet actual application requirements.

In one embodiment of the present disclosure, the block portion 12 may be a vertical structure, and may be a sheet-like body, a sector body, or a leaf-shaped body. The block portion 12 turns or rotates so that the fluid is driven or controlled by the block portion 12 to dissipate heat.

In one embodiment of the present disclosure, the assembly portion 11 is provided with an electrically conductive portion 14, or the assembly portion 11 itself is an electrically conductive portion. The electrically conductive portion 14 is for conducting an electrical current so as to drive the block portion 12 to operate by electrical power. In this embodiment, the electrically conductive portion 14 may be provided at the assembly portion 11, and the block portion 12 may be a leaf and be provided at the electrically conductive portion 14. The electrically conductive portion 14 has a positive pole 141 and a negative pole 142, the object 10 may be a printed circuit board and has a corresponding electrically conductive portion 106, and the positive pole 141 and the negative pole 142 are connected to the corresponding electrically conductive portion 106. Thus, when the object 10 operates in coordination with an electronic apparatus, with the coordination of the positive pole 141 and the negative pole 142 connected to the electrically conductive portion 106, electrical power needed for operating the block portion 12 is supplied.

In one embodiment of the present disclosure, the heat transfer module 16 includes a heat conductor 161 and an intermediate heat conductor 162. The heat conductor 161 is a heat sink, and the heat generator 60 is an IC, CPU, GPU or a heating element. The heat conductor 161 is provided at the heat generator 60, the intermediate heat conductor 162 is connected to the block portion 12 and the heat conductor 161, the heat conductor 161 is for guiding the heat source of the heat generator 60 to the intermediate heat conductor 162, the intermediate heat conductor 162 is for guiding the heat source to the block portion 12, and the block portion 12 rotates and hence generates guidance or disturbance of the fluid so as to dissipate heat by using the fluid, thereby enabling the block portion 12 to achieve an effect of effectively guiding or disturbing the fluid to dissipate heat.

In one embodiment of the present disclosure, the assembly portion 11, the positive pole 141 or the negative pole 142 is a protruding body, solder paste, a solder ball, a solder block, a sheet, a cylinder or a concave body, thereby enabling the present disclosure to better meet actual assembly requirements.

In one embodiment of the present disclosure, the assembly portion 11, the positive pole 141 or the negative pole 142 is welded to the tin layer 101 (or the copper layer 102) of the object 10 (or a printed circuit board), so as to achieve an effect of a secure arrangement of the assembly portion 11, the positive pole 141 and the negative pole 142 at the object 10.

In one embodiment of the present disclosure, the fluid device 1 further includes a cover 15, which covers, shields or protects the block portion 12. The cover 15 may cover, shield or protect the block portion 12 according to requirements, so that the fluid is guided by the cover 15 to the position at which the heat source is generated or to the position needing heat dissipation when the block portion 12 generates a wind flow.

In one embodiment of the present disclosure, the assembly portion 11 (or the fluid device 1, or the heat transfer module 16) and the heat transfer module 16 are respectively welded or bonded to the object 10 and the heat generator 60, wherein the welding and heating causes the solder to produce a descending, sinking or downward force or pulling force when the solder is cooled from a liquid state to a solid state, or the bonding produces a descending, sinking or downward force or pulling force, so that the assembly portion 11 (or the fluid device 1) and the heat transfer module 16 are respectively adhered, attached or become close to the object 10 and the heat generator 60.

In one embodiment of the present disclosure, during welding or bonding, solder paste, solder balls or adhesives become liquid or soft bodies due to heating, and then become solid or hard bodies after cooling. The solder paste, solder balls or adhesives may be provided at the fluid device 1, the assembly portion 11, the heat transfer module 16, the object 10, or the heat generator 60.

Figure 20:
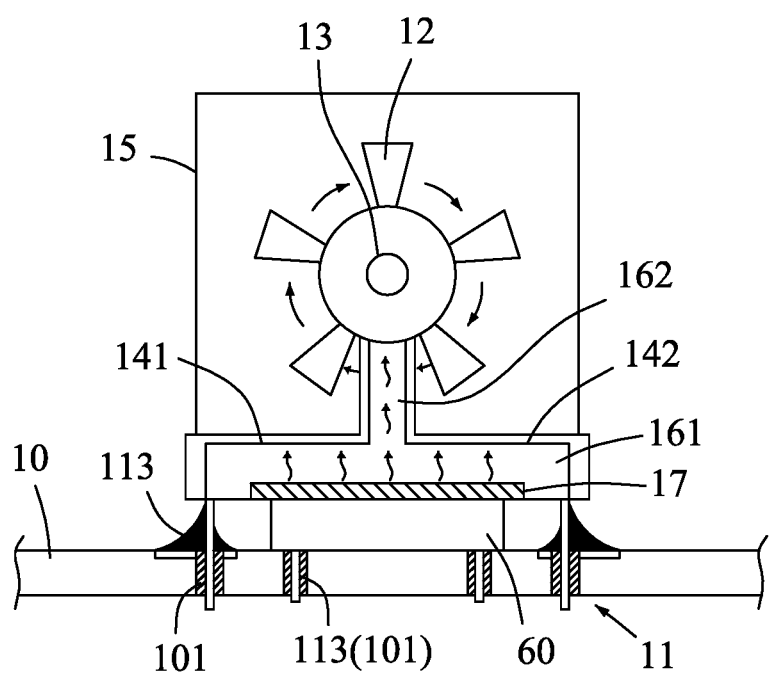
FIG. 20 is a schematic diagram of a state of use of a fluid device according to an eleventh embodiment of the present disclosure.

As shown in FIG. 20, in one embodiment of the present disclosure, a difference from the above embodiments is that, an intermediate heat sink 17 is present between the heat conductor 161 and the heat generator 60, wherein the intermediate heat sink 17 is a heat dissipation paste, heat dissipation pad or heat dissipation elastic body.

During use, the intermediate heat conductor 162 transfers the heat source of the heat generator 60 to the heat conductor 161, the heat conductor 161 then guides the heat source to the intermediate heat conductor 162 for the intermediate heat conductor 162 to guide the heat source to the block portion 12, and the block portion 12 rotates and hence generates guidance or disturbance of the fluid so as to dissipate heat by using the fluid, thereby enabling the block portion 12 to achieve an effect of effectively guiding or disturbing the fluid to dissipate heat.

Figure 21:
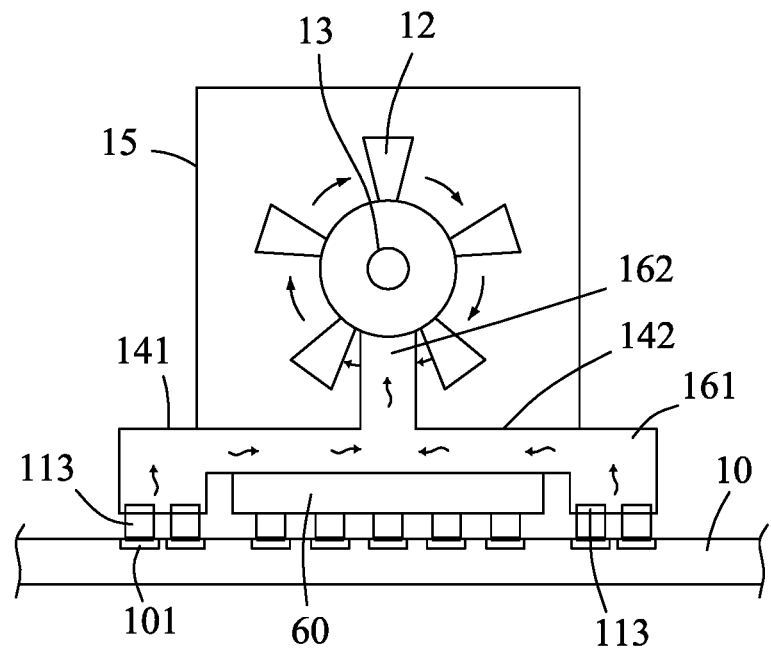
FIG. 21 is a schematic diagram of a state of use of a fluid device according to a twelfth embodiment of the present disclosure.

Referring to FIG. 21, in one embodiment of the present disclosure, a difference from the above embodiments is that, the assembly portion 11 (or the heat transfer module 16) has a weldable surface 113 (for example, a solder paste or solder balls), and the object 10 has a tin layer 101 (or a copper layer 102), so that the assembly portion 11 can be welded to the tin layer 101 (or the copper layer 102) of the object 10 by using the weldable surface 113. Due to welding and heating, the weldable surface 113 and the tin layer 101 (or the copper layer 102) become liquid and are then cooled to become solid, and a descending, sinking or downward force or pulling force is produced by the welding. Thus, in addition to enabling the fluid device 1 to be securely arranged at the object 10 by using the assembly portion 11, the heat transfer module 16 can further be adhered to the heat generator 60 to facilitate heat transfer of the heat source.

In one embodiment of the present disclosure, the assembly portion 11 (or the fluid device 1, or the heat transfer module 16) may be adhered to the object 10. During the adhesion, the adhesives of the assembly portion 11 and the object 10 become liquid or soft bodies due to heating, and then become solid or hard bodies after cooling. Moreover, a descending sinking or downward force or pulling force is produced by the adhesion, such that the heat transfer module 16 is adhered or attached or becomes closes to the heat generator 60 or the object 10.

Figure 22:
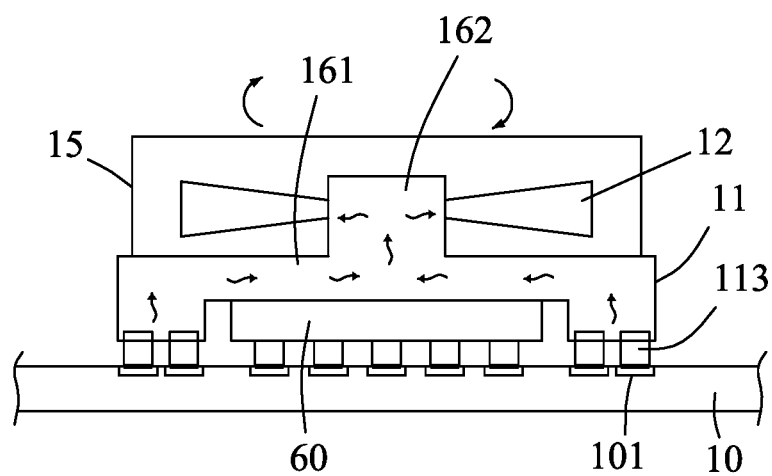
FIG. 22 is a schematic diagram of a state of use of a fluid device according to a thirteenth embodiment of the present disclosure.

Referring to FIG. 22, in one embodiment of the present disclosure, a difference from the foregoing embodiments is that, in addition to being the vertical form in as in the above embodiments, the block portion 12 of the fluid device may be configured as a horizontal form as in this embodiment, thereby enabling the present disclosure to better meet actual application requirements.

Figure 23:
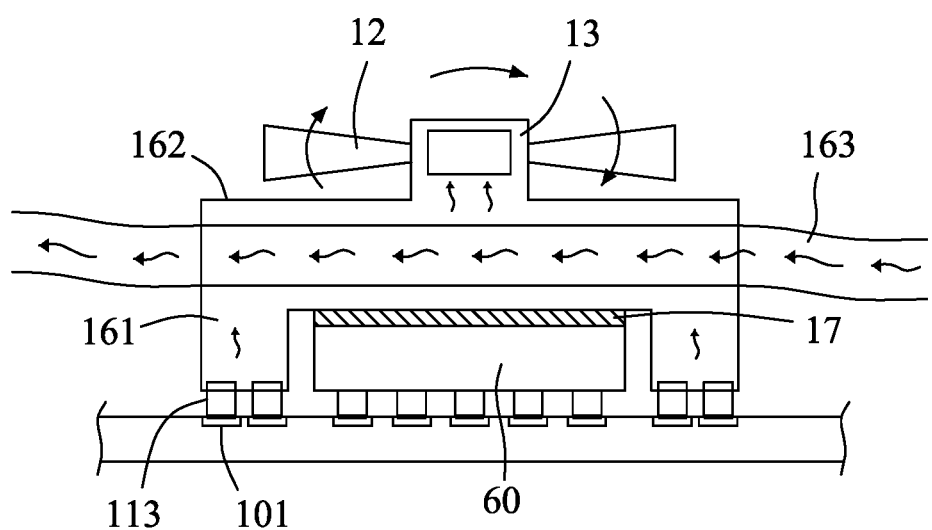
FIG. 23 is a schematic diagram of a state of use of a fluid device according to a fourteenth embodiment of the present disclosure.

Referring to FIG. 23, in one embodiment of the present disclosure, a difference from the foregoing embodiments is that, the heat conductor 161 of the heat transfer module 16 has a channel portion 163, which allows a liquid fluid to pass through to dissipate heat, or allows a gaseous fluid to pass through to dissipate heat.

During use, the intermediate heat conductor 162 transfers the heat source of the heat generator 60 to the heat conductor 161, and the heat conductor 161 may first dissipate heat of the heat source by using the liquid fluid or gaseous fluid in the channel 163. Then, the heat conductor 161 guides the remaining heat source to the intermediate heat conductor 162 for the intermediate heat conductor 162 to guide the heat source to the block portion 12, and the block portion 12 rotates and hence generates guidance or disturbance of the fluid so as to dissipate heat by using the fluid, thereby enabling the block portion 12 to achieve an effect of effectively guiding or disturbing the fluid to dissipate heat.

The present disclosure is described by way of the preferred embodiments above. A person skilled in the art should understand that, these embodiments are merely for describing the present disclosure are not to be construed as limitations to the scope of the present disclosure. It should be noted that all equivalent changes, replacements and substitutions made to the embodiments are to be encompassed within the scope of the present disclosure. Therefore, the scope of protection of the present disclosure should be accorded with the broadest interpretation of the appended claims.

What is claimed is:
1. A fluid device, comprising:
a shaft portion;
an assembly portion, for assembling with an object, provided with an electrically conductive portion; and
a block portion, provided at the assembly portion or the shaft portion, for blocking or guiding a fluid, wherein the block portion is installed at a position through which the fluid passes and guides or dissipates heat to the fluid at the installation position or near the installation position, wherein the electrically conductive portion conducts an electric current to drive the block portion to move by electric power, the electrically conductive portion comprising:
a heat transfer module thermally and physically connected to the block portion and a heat generator for transferring a heat source of the heat generator to the block portion to dissipate heat, wherein the heat transfer module comprises:
    a heat conductor provided at the heat generator for guiding the heat source of the heat generator to the intermediate heat conductor; and
    an intermediate heat conductor thermally and physically connected to the block portion and the heat conductor for guiding the heat source to the block portion to dissipate the heat,
wherein the electrically conductive portion has a positive pole and a negative pole, the object has a corresponding electrically conductive portion, and the positive pole and the negative pole are each electrically connected to the corresponding electrically conductive portion by soldering the positive pole and negative pole to the object so as to provide the assembly portion at the object and the heat generator,
wherein the object is a printed circuit board (PCB), and the heat generator is an integrated circuit (IC), a central processing unit (CPU), or a graphics processing unit (GPU).

2. The fluid device according to claim 1, wherein the fluid device is picked up by a tool, moved to a predetermined height of an assembly position of the object by the tool, and released or set free from the tool, such that the assembly portion is placed at the assembly position of the object.

3. The fluid device according to claim 1, wherein the fluid device is picked up by a tool, moved to an assembly position of the object by the tool, pressed down by the tool, and released or set free from the tool, such that the assembly portion is placed at the assembly position of the object.

4. The fluid device according to claim 1, wherein the fluid device is picked up by a tool, moved to an assembly position of the object by the tool, elastically pressed down by the tool, and released or set free from the tool, such that the assembly portion is placed at the assembly position of the object.

5. The fluid device according to claim 1, wherein the fluid device is picked up by a tool, moved to an assembly position of the object by the tool, and released or set free from the tool, such that the assembly portion is placed at the assembly position of the object.

6. The fluid device according to claim 1, wherein the fluid device is picked up by a tool and moved to an assembly position of the object by the tool, the tool senses that the fluid device comes into contact with the object, and the fluid device is released or set free from the tool, such that the assembly portion is placed at the assembly position of the object.

7. The fluid device according to claim 1, wherein once the fluid device is picked up by a tool, a comparison device is provided to compare the fluid device and an assembly position or an assembly distance of the object, and the fluid device is moved by the tool according to comparison information of the comparison device.

8. The fluid device according to claim 1, wherein the block portion performs blocking or rotating to change a direction of the fluid in the object; alternatively, the object has an entering portion, which allows the fluid to enter the object so that the fluid device comes into contact with the fluid.

9. The fluid device according to claim 1, wherein the block portion is a sheet-like body, a sector body, or a leaf-shaped body, and the block portion is movable or rotatable.

10. The fluid device according to claim 1, wherein the block portion is a sheet-like body, a sector body, or a leaf-shaped body.

11. The fluid device according to claim 1, wherein solder that is heated, cooled, and solidified is present between the assembly portion and the object.

12. The fluid device according to claim 1, wherein the fluid device, the assembly portion or the heat transfer module is welded or bonded to the object or the heat generator, so as to provide the fluid device, the assembly portion or the heat transfer module at the object or the heat generator.

13. The fluid device according to claim 12, wherein welding and heating causes a solder to produce a descending, sinking or downward force or pulling force when the solder is cooled to a solid state, or bonding produces a descending, sinking or downward force or pulling force, so that the fluid device, the assembly portion or the heat transfer module is adhered, attached or becomes close to the object or the heat generator.

14. The fluid device according to claim 1, wherein the heat transfer module or the heat conductor of the heat transfer module has a channel portion, and the channel portion allows the fluid to pass through to dissipate the heat.

15. The fluid device according to claim 1, wherein the fluid device further comprises a cover which covers, shields or protects the block portion.

* * * * *